United States Patent
Di Mare et al.

(10) Patent No.: US 10,614,259 B2
(45) Date of Patent: Apr. 7, 2020

(54) METHODS OF MODELLING AT LEAST A PART OF A GAS TURBINE ENGINE

(71) Applicant: ROLLS-ROYCE plc, London (GB)

(72) Inventors: Luca Di Mare, London (GB); Davendu Y. Kulkarni, Derby (GB); Gan Lu, London (GB)

(73) Assignee: ROLLS-ROYCE plc, London (GB)

( * ) Notice: Subject to any disclaimer, the term of this patent is extended or adjusted under 35 U.S.C. 154(b) by 1053 days.

(21) Appl. No.: 15/075,686

(22) Filed: Mar. 21, 2016

(65) Prior Publication Data

US 2016/0283623 A1    Sep. 29, 2016

(30) Foreign Application Priority Data

Mar. 24, 2015 (GB) .................................. 1504920.8

(51) Int. Cl.
*G06G 7/48* (2006.01)
*G06F 30/20* (2020.01)
*G06F 30/15* (2020.01)
*G06F 30/17* (2020.01)

(52) U.S. Cl.
CPC ............. *G06F 30/20* (2020.01); *G06F 30/15* (2020.01); *G06F 30/17* (2020.01)

(58) Field of Classification Search
CPC ............. G06F 17/5009; G06F 17/5086; G06F 17/5095
USPC .......................................................... 703/7
See application file for complete search history.

(56) References Cited

U.S. PATENT DOCUMENTS

| | | |
|---|---|---|
| 6,219,049 B1 | 4/2001 | Zuffante et al. |
| 6,944,580 B1 | 9/2005 | Blume et al. |
| 2007/0118271 A1* | 5/2007 | Wiseman ........... G05B 23/0254 701/100 |
| 2010/0100248 A1* | 4/2010 | Minto .................... F01D 11/20 700/287 |

OTHER PUBLICATIONS

"Solidworks Inc: Solidworks 2013 Help: Collision Detection." https://web.archive.org/web/20131221031704/http://help.solidworks.com/2013/English/SolidWorks/sldworks/t_Collision_Detection_SWassy.htm. Oct. 13, 2016.

(Continued)

*Primary Examiner* — Andre Pierre Louis
(74) *Attorney, Agent, or Firm* — Oliff PLC (57) ABSTRACT

A method of modelling at least a part of a gas turbine engine, method including: determining whether a first match feature data entity, defining a first location where a first physical feature may associate with another physical feature of a data structure, and a second match feature data entity, defining a second location where the second physical feature may associate with another physical feature of the data structure, satisfy a first matching criterion, the data structure including: a first data entity representing a geometrical shape of the first physical feature, the first data entity being associated with the first match feature data entity; and a second data entity representing a geometrical shape of the second physical feature, the second data entity being associated with the second match feature data entity; and performing relative movement between the first physical feature and the second physical feature within a model using the determination.

17 Claims, 6 Drawing Sheets

(56) References Cited

OTHER PUBLICATIONS

"Solidworks Inc: Solidworks 2013 Help—Mate References." http://help.solidworks.com/2013/english/SolidWorks/sldworks/c_Mate_References_Overview_SWassy.htm. Oct. 13, 2016.
"Solidworks Inc.: Solidworks 2013 Help—Fixing the Position of a Component." http://help.solidworks.com/2013/english/SolidWorks/sldworks/t_fixing_the_position_of_a_component.htm. Oct. 13, 2016.
Oct. 24, 2016 Search Report issued in European Patent Application No. 16 16 0588.
Feb. 22, 2018 European Office Action issued in European Applicaiton No. 16 160 588.6.
Hughes, T.J.R. et al. "Isogeometric Analysis: CAD, Finite Elements, Nurbs, Exact Geometry and Mesh Refinement". Comput. Methods Appl. Mech. Engrg. 194, 2005, pp. 4135-4195.
Shah, JJ et al. "Expert Form Feature Modelling Shell". Department of Mechanical and Aerospace Engineering, Arizona State University, vol. 20, No. 9, Nov. 9, 1988, pp. 515-524.
Sacks, Rafael et al. "Parametric 3D Modeling in Building Construction With Examples From Precast Concrete". Automation in Construction 13, 2004, pp. 291-312.
Shah, JJ. "Assessment of Features Technology". Department of Mechanical and Aerospace Engineering, Arizona State University, vol. 23, No. 5, Jun. 5, 1991, pp. 331-343.
Chen, Xiang et al. "A Flexible Assembly Retrieval Approach for Model Reuse". Computer-Aided Design 44, 2012, pp. 554-574.
Chaudhari, Vinod et al. "Integrated Preliminary Design Approach for Turbomachinery Design". Proceedings of ASMR Turbo Expo 2011, GT2011, Jun. 6-10, 2011, Vancouver, British Columbia, Canada.
Chang, Kuang-Hua. "A Review on Shape Engineering and Design Parameterization in Reverse Engineering". Reverse Engineering—Recent Advances and Applications, pp. 161-186, Mar. 2012.
Bouma, William et al. "A Geometric Constraint Solver". Department of Computer Science, Purdue University, Courant Institute, Jan. 1994.

Yan-Hong, Yang et al. "Design of Hydraulic Transmission Bicycle Based on Top-Down Method". Advanced Materials Research, vols. 468-471, pp. 867-870, Feb. 2012, ISSN: 1662-8985.
Dye, Christopher et al. "CAD-Based Parametric Cross-Section Designer for Gas Turbine Engine MDO Applications". Computer-Aided Design and Applications, vol. 4, No. 1-4, pp. 509-518, Aug. 2013.
Shah, Jami J. et al. "Assembly Modeling as an Extension of Feature-Based Design". Research in Engineering Design, 1993, vol. 5, pp. 218-237.
Buchanan, S. Alasdair et al. "Constraint Definition System: A Computer-Algebra Based Approach to Solving Geometric-Constraint Problems". Computer-Aided Design, vol. 25, No. 12, Dec. 12, 1993, pp. 741-750.
Balakrishnan, Govind P. "Constraint-Based Approach to Product Modelling". Arizona State University, Dec. 1993.
Bronsvoort, Willem F. et al. "Developments in Feature Modelling". Computer-Aided Design and Applications, vol. 3, No. 5, 2006, pp. 655-664.
Ali, Ahsan. "Declarative Approach to Form Feature Definition". Arizona State University, Aug. 1994.
Capoyleas, Vasilis et al. "Generic Naming in Generative, Constraint-Based Design". Computer-Aided Design, vol. 28, No. 1, pp. 17-26, 1996.
Di Mare, Luca et al. "Virtual Gas Turbines: Geometry and Conceptual Description". Proceedings of ASME TurboExpo 2011, GT2011, Jun. 6-10, 2011, Vancouver, Canada.
Milli, Andrea et al. "PADRAM: Parametric Design and Rapid Meshing System for Complex Turbomachinery Configurations". Proceedings of ASME Turbo Expo 2012, Jun. 11-15, 2012, Copenhagen, Denmark.
Kim, Junhwan et al. "Standardized Data Exchange of CAD Models With Design Intent". Computer-Aided Design 40, 2008, pp. 760-777.
Shah, JJ et al. "Parametric and Feature-Based CAD/CAM", section 10.5 "Constraint Tools" under Implementation Tools, Oct. 1995, pp. 408-418.

* cited by examiner

METHODS OF MODELLING AT LEAST A PART OF A GAS TURBINE ENGINE

TECHNOLOGICAL FIELD

The present disclosure concerns methods of modelling at least a part of a gas turbine engine.

BACKGROUND

Figure 1:
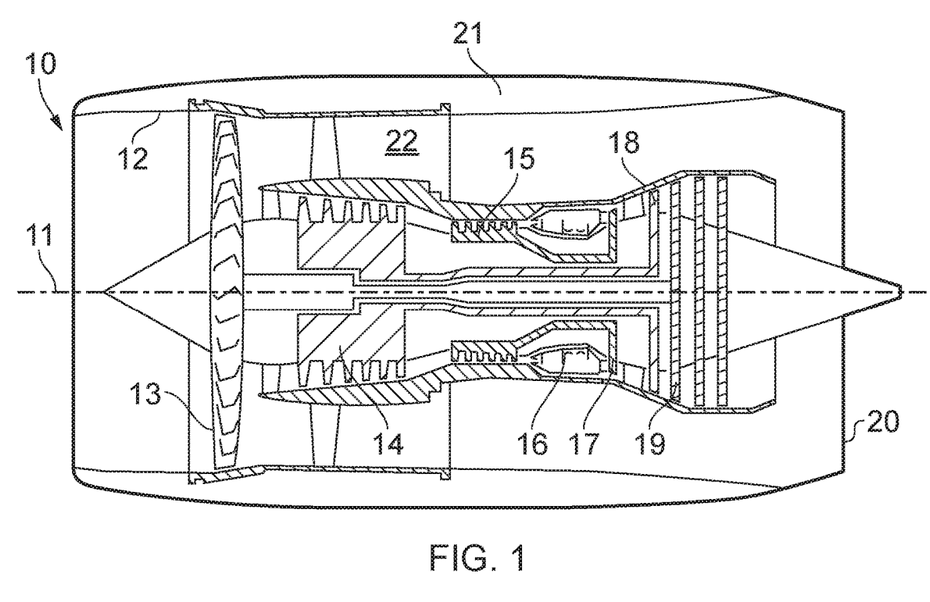
FIG. 1 illustrates a cross sectional side view of a gas turbine engine.

Gas turbine engines may be used to power various systems. For example, gas turbine engines may be used to power aircraft, ships and electrical generators. FIG. 1 illustrates a gas turbine engine 10 for an aircraft according to an example. The gas turbine engine 10 has a principal and rotational axis 11 and comprises, in axial flow series, an air intake 12, a propulsive fan 13, an intermediate pressure compressor 14, a high-pressure compressor 15, combustion equipment 16, a high-pressure turbine 17, and intermediate pressure turbine 18, a low-pressure turbine 19, and an exhaust nozzle 20. A nacelle 21 generally surrounds the engine 10 and defines both the intake 12 and the exhaust nozzle 20.

In operation, air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by a suitable interconnecting shaft.

Modelling a gas turbine engine may be a time consuming process and require significant human resources due to the complex structure of the gas turbine engine. For example, a gas turbine engine may be modelled using a traditional computer aided design (CAD) package whereby the model is generated by assembling components. Where a part of a component, a component, or an assembly of components are moved within the model, other parts, components and/or assemblies may require moving within the model as a result. Such an operation may be a time consuming task and require a high level of precision in re-positioning components.

BRIEF SUMMARY

According to various embodiments there is provided a method of modelling at least a part of a gas turbine engine, the method comprising: determining whether a first match feature data entity, defining a first location where a first physical feature may associate with another physical feature of a data structure, and a second match feature data entity, defining a second location where the second physical feature may associate with another physical feature of the data structure, satisfy a first matching criterion, the data structure including: a first data entity representing a geometrical shape of the first physical feature, the first data entity being associated with the first match feature data entity; and a second data entity representing a geometrical shape of the second physical feature, the second data entity being associated with the second match feature data entity; and performing relative movement between the first physical feature and the second physical feature within a model using the determination.

According to various embodiments there is provided a method of modelling at least a part of a mechanical system, the method comprising: determining whether a first match feature data entity, defining a first location where a first physical feature may associate with another physical feature of a data structure, and a second match feature data entity, defining a second location where the second physical feature may associate with another physical feature of the data structure, satisfy a first matching criterion, the data structure including: a first data entity representing a geometrical shape of the first physical feature, the first data entity being associated with the first match feature data entity; and a second data entity representing a geometrical shape of the second physical feature, the second data entity being associated with the second match feature data entity; and performing relative movement between the first physical feature and the second physical feature within a model using the determination.

The first physical feature and/or the second physical feature may be one of: a part of a component of a gas turbine engine; a component of a gas turbine engine; and an assembly of components of a gas turbine engine.

The data structure may be arranged in a tree structure having parent and child relationships between data entities, and wherein the blocks of: determining whether the first match feature data entity and the second match feature data entity satisfy the first matching criterion; and performing relative movement between the first physical feature and the second physical feature within a model using the determination, may be performed according to the order of the parent and child relationships between data entities in the tree structure.

The first match feature data entity may include a first matching perimeter, and the second match feature data entity may include a second matching perimeter, and the first matching criterion may be whether the first matching perimeter and the second matching perimeter overlap in the model.

The first match feature data entity may include a first identification tag, and the second match feature data entity may include a second identification tag, and the first matching criterion may be whether the first identification tag is the same as the second identification tag.

The method may further comprise determining whether a first match feature data entity of the data structure and a second match feature data entity of the data structure satisfy a second matching criterion, wherein the first match feature may include a first matching perimeter, and the second match feature may include a second matching perimeter, and the second matching criterion may be whether the first matching perimeter and the second matching perimeter overlap in the model.

The first match feature data entity may include data indicating that the first location is for coupling with another physical feature, and the second match feature data entity may include data indicating that the second location is for coupling with another physical feature.

Performing relative movement may include coupling the first and second physical features at the first and second locations respectively.

The first match feature data entity may include data indicating that the first location defines a first clearance with another physical feature, and the second match feature data entity may include data indicating that the second location defines a second clearance with another physical feature.

Performing relative movement may include positioning the first and second physical features to have the greater of the first clearance and the second clearance between the first location and the second location.

The data structure may comprise a plurality of data entities representing geometrical shapes of a plurality of physical features, at least some of the data entities being associated with a match feature data entity may define a location where the physical feature may associate with another physical feature, and the method may further comprise iteratively performing: determination of match point satisfaction of a first matching criterion for the plurality of data entities; and performing relative movement for the plurality of physical features within the model.

The method may further comprise receiving a user input signal indicating that at least one of the first physical feature and the second physical are moveable or modifiable, or non-moveable or non-modifiable within the model.

The method may further comprise determining whether the first physical feature is moveable or modifiable within the model; and preventing movement, or not performing movement or modification, of the first physical feature within the model where the first physical feature is determined to be non-moveable or non-modifiable.

The method may further comprise determining whether the second physical feature is moveable or modifiable within the model; and preventing movement, or not performing movement or modification, of the second physical feature within the model where the second physical feature is determined to be non-moveable or non-modifiable.

The method may further comprise determining whether the first and second physical features are moveable or modifiable within the model; and wherein performing relative movement includes moving or modifying pre-set geometry configurations of the first and second physical features where the first and second physical features are determined to be moveable or modifiable.

According to various embodiments there is provided a computer program that, when read by a computer, causes performance of the method as described in any of the preceding paragraphs.

According to various embodiments there is provided a non-transitory computer readable storage medium comprising computer readable instructions that, when read by a computer, causes performance of the method as described in any of the preceding paragraphs.

According to various embodiments there is provided apparatus for modelling at least a part of a gas turbine engine, the apparatus comprising: a controller to: determine whether a first match feature data entity, defining a first location where a first physical feature may associate with another physical feature of a data structure, and a second match feature data entity, defining a second location where the second physical feature may associate with another physical feature of the data structure, satisfy a first matching criterion, the data structure including: a first data entity representing a geometrical shape of the first physical feature, the first data entity being associated with the first match feature data entity; and a second data entity representing a geometrical shape of the second physical feature, the second data entity being associated with the second match feature data entity; and perform relative movement between the first physical feature and the second physical feature within a model using the determination.

According to various embodiments there is provided apparatus for modelling at least a part of a mechanical system, the apparatus comprising: a controller to: determine whether a first match feature data entity, defining a first location where a first physical feature may associate with another physical feature of a data structure, and a second match feature data entity, defining a second location where the second physical feature may associate with another physical feature of the data structure, satisfy a first matching criterion, the data structure including: a first data entity representing a geometrical shape of the first physical feature, the first data entity being associated with the first match feature data entity; and a second data entity representing a geometrical shape of the second physical feature, the second data entity being associated with the second match feature data entity; and perform relative movement between the first physical feature and the second physical feature within a model using the determination.

The first physical feature and/or the second physical feature may be one of: a part of a component of a gas turbine engine; a component of a gas turbine engine; and an assembly of components of a gas turbine engine.

The data structure may be arranged in a tree structure having parent and child relationships between data entities, and wherein the blocks of: determining whether the first match feature data entity and the second match feature data entity satisfy the first matching criterion; and performing relative movement between the first physical feature and the second physical feature within a model using the determination, may be performed according to the order of the parent and child relationships between data entities in the tree structure.

The first match feature data entity may include a first matching perimeter, and the second match feature data entity includes a second matching perimeter, and the first matching criterion may be whether the first matching perimeter and the second matching perimeter overlap in the model.

The first match feature data entity may include a first identification tag, and the second match feature data entity may include a second identification tag, and the first matching criterion may be whether the first identification tag is the same as the second identification tag.

The controller may be to: determine whether a first match feature data entity of the data structure and a second match feature data entity of the data structure satisfy a second matching criterion, wherein the first match feature data entity includes a first matching perimeter, and the second match feature data entity includes a second matching perimeter, and the second matching criterion may be whether the first matching perimeter and the second matching perimeter overlap in the model.

The first match feature data entity may include data indicating that the first location is for coupling with another physical feature, and the second match feature data entity may include data indicating that the second location is for coupling with another physical feature.

The controller may be to couple the first and second physical features at the first and second locations respectively when relative movement is performed.

The first match feature data entity may include data indicating that the first location defines a first clearance with another physical feature, and the second match feature data entity may include data indicating that the second location defines a second clearance with another physical feature.

Performing relative movement may include positioning the first and second physical features to have the greater of the first clearance and the second clearance between the first location and the second location.

The data structure may comprise a plurality of data entities representing geometrical shapes of a plurality of physical features, wherein at least some of the data entities may be associated with a match feature data entity defining a location where the physical feature may associate with another physical feature, and the apparatus may be to iteratively perform: determination of match point satisfaction of a first matching criterion for the plurality of data entities; and perform relative movement for the plurality of physical features within the model.

The controller may be to receive a user input signal indicating that at least one of the first physical feature and the second physical are moveable or modifiable, or non-moveable or non-modifiable within the model.

The controller may be to determine whether the first physical feature is moveable or/modifiable within the model; and prevent movement, or not perform movement or modification, of the first physical feature within the model where the first physical feature is determined to be non-moveable or non-modifiable.

The controller may be to determine whether the second physical feature is moveable or modifiable within the model; and prevent movement, or not perform movement or modification, of the second physical feature within the model where the second physical feature is determined to be non-moveable or non-modifiable.

The controller may be to determine whether the first and second physical features are moveable or modifiable within the model; and may be to move the first and second features where the first and second physical features are determined to be moveable or modifiable.

BRIEF DESCRIPTION

Embodiments will now be described by way of example only, with reference to the Figures, in which.

DETAILED DESCRIPTION

Figure 2:
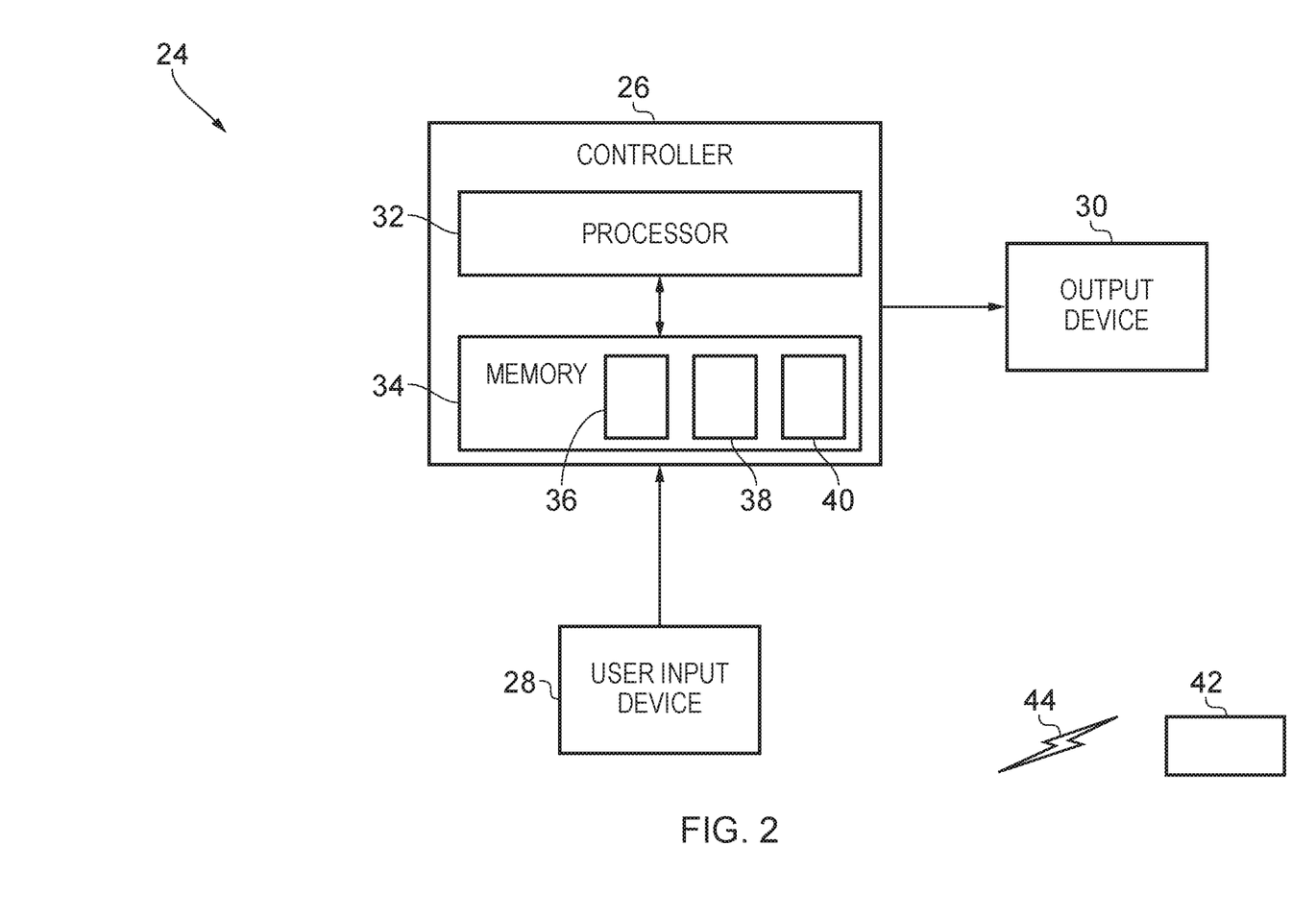
FIG. 2 illustrates a schematic diagram of apparatus for modelling at least a part of a gas turbine engine according to various examples.

FIG. 2 illustrates an apparatus 24 for modelling a gas turbine engine 10. The apparatus 24 includes a controller 26, a user input device 28, and an output device 30. The apparatus 24 may be any computing device and may be located in a single location (for example, the apparatus 24 may be a personal computer (PC) located in a single room) or may be distributed across a plurality of locations (for example, the controller 26 may be located remotely (in another room, building, city, or country) from the user input device 28 and the output device 30).

Figure 8:
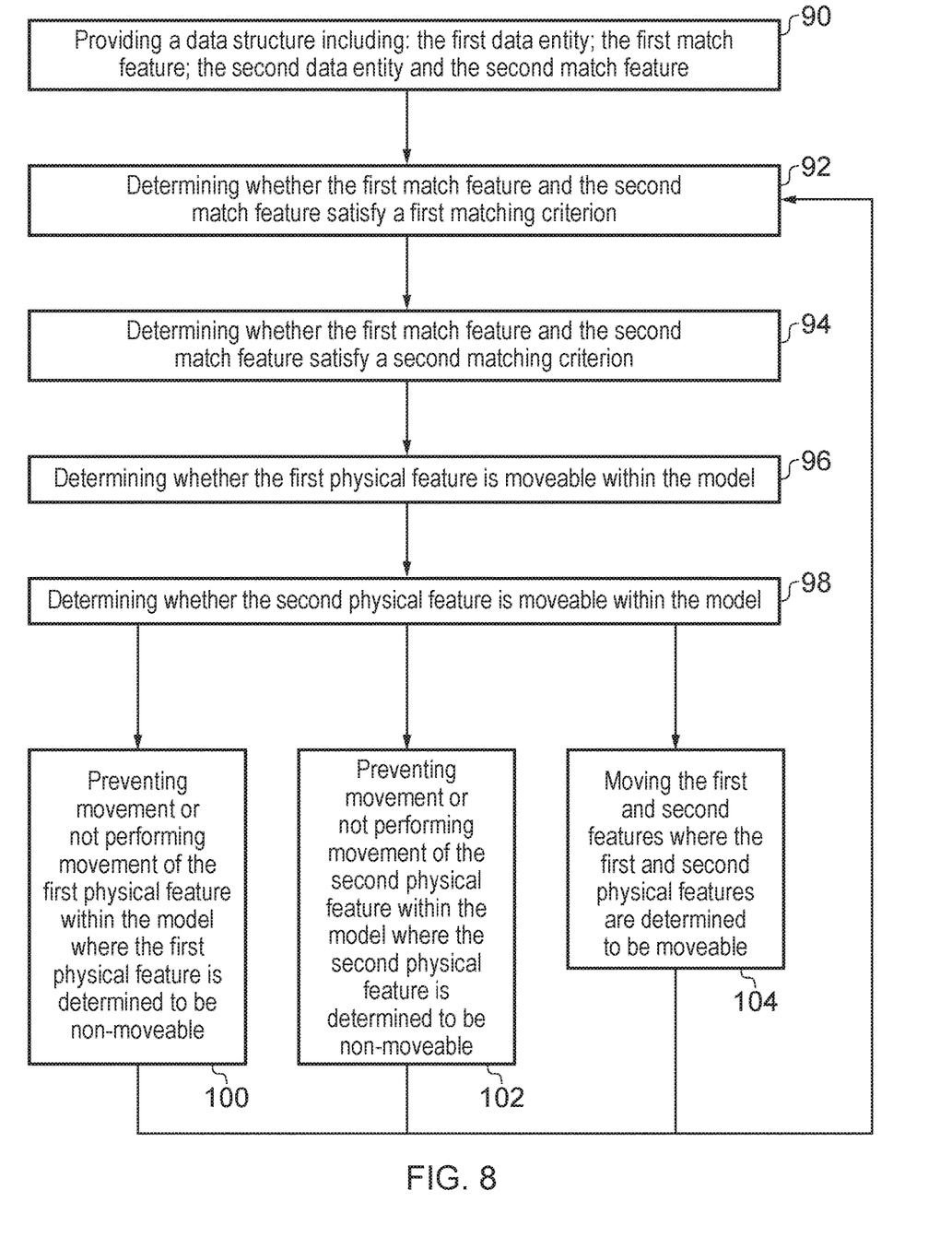
FIG. 8 illustrates a flow diagram of a method of modelling at least a part of a gas turbine engine according to various examples.

The controller 26 may comprise any suitable circuitry to cause performance of the methods described herein and as illustrated in FIG. 8. For example, the controller 26 may comprise at least one application specific integrated circuit (ASIC) and/or at least one field programmable gate array (FPGA) to perform the methods described herein and as illustrated in FIG. 8. By way of another example, the controller 26 may comprise at least one processor 32 and at least one memory 34. The memory 34 stores a computer program 36 comprising computer readable instructions that, when read by the processor 32, causes performance of the methods described herein, and as illustrated in FIG. 8. The computer program 36 may be software or firmware, or may be a combination of software and firmware.

The memory 34 stores a data structure 38 that is described in greater detail in the following paragraphs. Generally, the data structure 38 includes a plurality of data entities from which a model of a gas turbine engine may be constructed. Additionally, the memory 34 may store at least one model 40 of a gas turbine engine generated by the apparatus 24 as described in the following paragraphs. In some examples, the memory 34 may not permanently store the model 40 of the gas turbine engine and instead, the model 40 may be built on demand and then stored (at least temporarily) by the memory 34.

The processor 32 may be located at a single location (for example, within a housing or cover of a computer), or may be distributed across a plurality of locations (for example, the processor 32 may be distributed within a plurality of separate housings or covers of different computers, which may be located in the same room, or in different rooms, buildings, cities or countries). The processor 32 may include at least one microprocessor and may comprise a single core processor, or may comprise multiple processor cores (such as a dual core processor, a quad core processor, and so on).

The memory 34 may be located at a single location (for example, within a housing or cover of a computer), or may be distributed across a plurality of locations (for example, the memory 34 may be distributed within a plurality of separate housings or covers of different computers, which may be located in the same room, or in different rooms, buildings, cities or countries). The memory 34 may be any suitable non-transitory computer readable storage medium, data storage device or devices, and may comprise a hard disk and/or solid state memory (such as flash memory). The memory 34 may be permanent non-removable memory, or may be removable memory (such as a universal serial bus (USB) flash drive).

The computer program 36, and/or the data structure 38, and/or the model 40, may be stored on a non-transitory computer readable storage medium 42. The computer program 36, and/or the data structure 38, and/or the model 40, may be transferred from the non-transitory computer readable storage medium 42 to the memory 34. The non-transitory computer readable storage medium 42 may be, for example, a USB flash drive, a compact disc (CD), a digital versatile disc (DVD) or a Blu-ray disc. In some examples, the computer program 42 may be transferred to the memory 34 via a wireless or wired signal 44.

The user input device 28 may include any suitable device or devices for enabling a user to control the apparatus 24. For example, the user input device 28 may include a keyboard, a keypad, a mouse, a touch pad, or a touch screen display. The controller 26 is arranged to receive control signals from the user input device 28.

The output device 30 may include any suitable device or devices for conveying information to a user. For example, the output device 30 may be a display (such as a liquid crystal display, or a light emitting diode display, or an active matrix organic light emitting diode display, or a thin film transistor display, or a cathode ray tube display) and/or a printing device (such as an inkjet printer or a laser printer for example). The controller 26 is arranged to provide a signal to the output device 30 to cause the output device 30 to convey information to the user.

Figure 3:
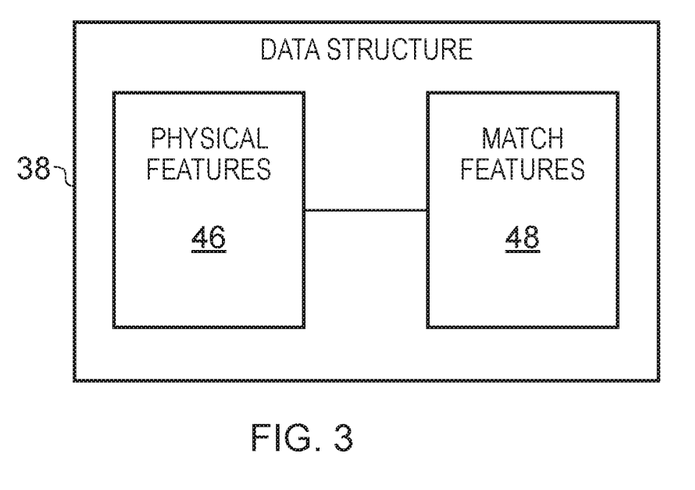
FIG. 3 illustrates a schematic diagram of a data structure according to various examples.

FIG. 3 illustrates a schematic diagram of the data structure 38 including a plurality of data entities 46 for a plurality of physical features, and a plurality of data entities 48 for a plurality of match features 48. It should be appreciated that the data structure 38 may be coded in any suitable programming language. For example, the data structure 38 may be implemented as a library of object oriented, hierarchical C++ classes.

The data entities 46 represent geometrical shapes of physical features of a gas turbine engine. As used herein, a 'physical feature' is an assembly of components, a component, or a part of a component, of a gas turbine engine. In other words, a 'physical feature' may not correspond to a single, recognisable component of the gas turbine engine, and each component of a gas turbine engine may be reproduced by assembling one or more physical features.

The data entities 46 may specify the allowable position or positions of physical features within the model of the gas turbine engine. For example, the data entities 46 may specify one or more axial positions for a bearing within a model of the gas turbine engine. Consequently, the data entities 46 may specify starting positions of components or assemblies of components within the model of the gas turbine engine.

Figure 4A:
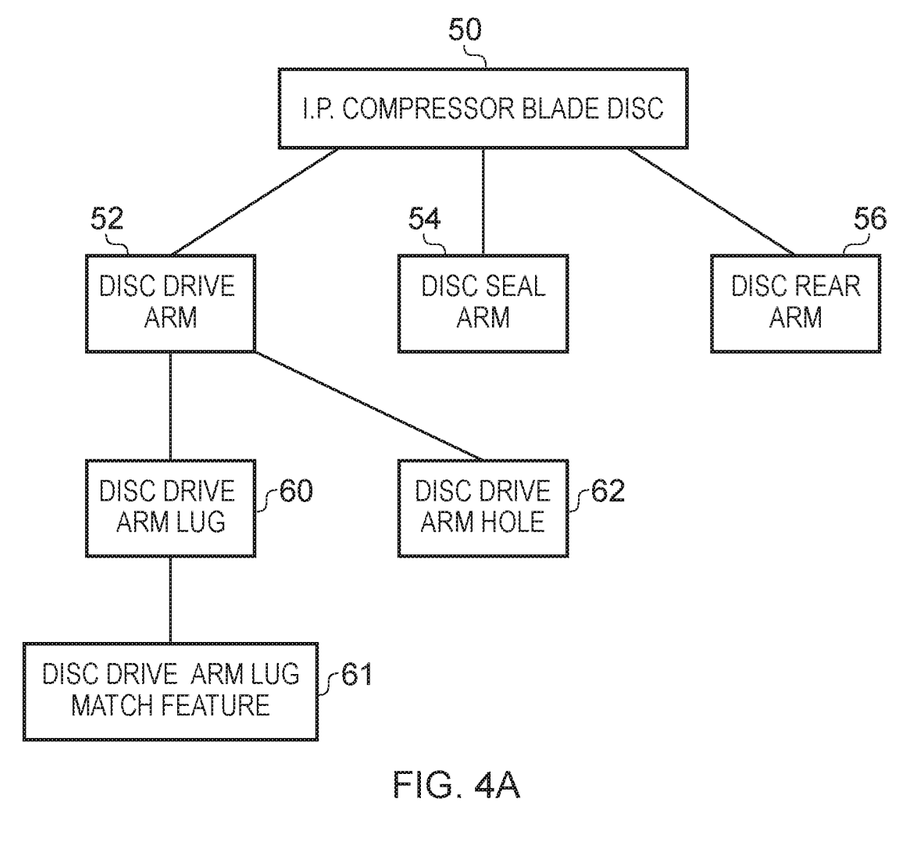
FIG. 4A illustrates a schematic diagram of data entities for physical features and a match feature, organised in a tree structure, for an intermediate pressure compressor blade disc according to an example.
Figure 4B:
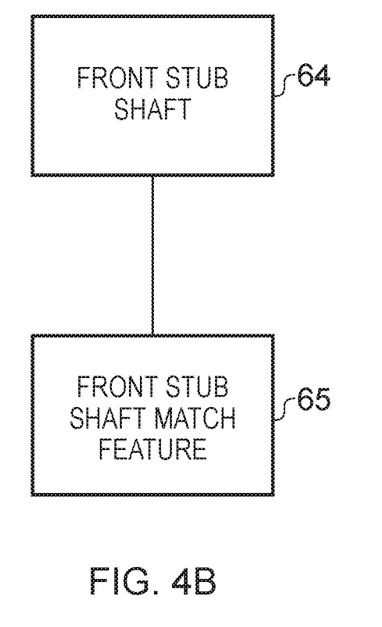
FIG. 4B illustrates a schematic diagram of data entities for a physical feature and a match feature, organised in a tree structure, for a front stub shaft according to an example.
Figure 5:
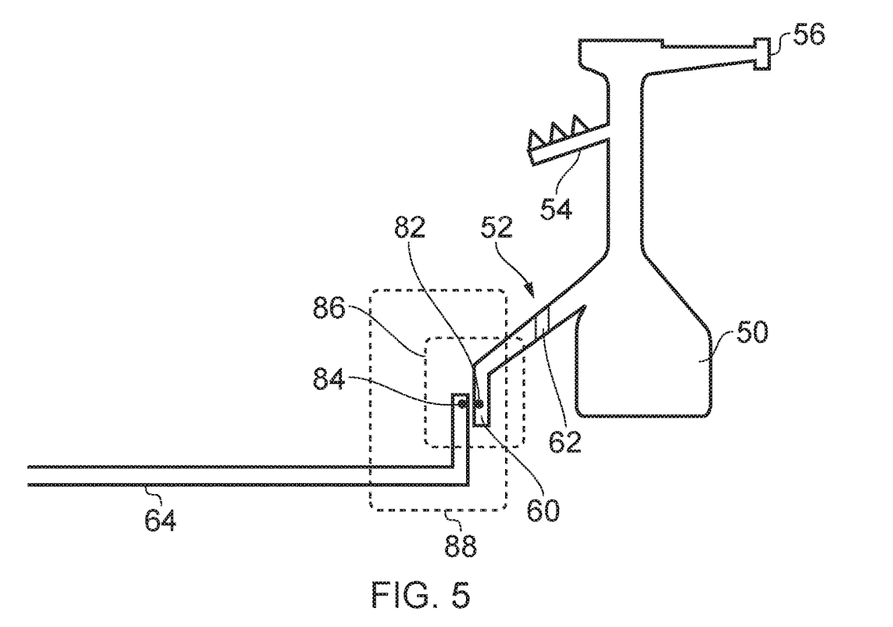
FIG. 5 illustrates a graphical representation of the data entities illustrated in FIGS. 4A & 4B according to an example.

A single assembly of physical features may form a component of a gas turbine engine (as illustrated in FIGS. 4 and 5 for an intermediate pressure compressor blade disc). Additionally, a plurality of assemblies of physical features may form a component of a gas turbine engine. For example, a seal may be formed by a rotatable assembly of physical features, and by a stationary assembly of physical features.

As described in greater detail in the following paragraphs with reference to FIGS. 4, 5 and 6, the data entities 46 may be arranged in a tree structure having parent and child relationships. In such a tree structure, data entities for physical features located near the root of the assembly tree carry general information and represent high level assemblies, such as spools or modules (or even the whole engine). Such physical features at the root of the tree may also be referred to as 'top level' physical features. Data entities for physical features located near the bottom of the assembly tree represent finer and finer geometric details. Consequently, a child physical feature is an addition to the parent physical feature and the position of the child physical feature may be determined by its position relative to the parent physical feature, and by the position of the parent physical feature. Such physical features near the bottom of the assembly tree may be referred to as 'bottom level' physical features.

In other examples, the data entities 46 may not be arranged in a tree structure and instead, at least some of the data entities 46 may be linked to one another. For example, at least one of the data entities 46 for a physical feature may include information that allows the physical feature to be positioned (or have its position, orientation, scale or any other geometric property modified according to certain criteria) relative to another physical feature.

It should be appreciated that in the above described examples, the data in the data entities 46 may enable the mechanical design intent of a component or an assembly of components to be generated and preserved. In more detail, where data entities are linked to other data entities or are arranged in a tree structure, the relative positioning of the physical features within the component may be preserved during assembly of the model.

In further examples, the first set of data entities 46 may not be linked to one another or have a tree structure.

The data structure 38 also includes a plurality of data entities 48 for a plurality of match features that are associated with the data entities 46 for the physical features. The match features may define where and how a physical feature may be associated with another physical feature within a model and what matching criterion or matching criteria is to be met for the matching to occur.

Where the data entities 46 are arranged in a tree structure, the plurality of data entities 48 for match features may be attached as child features of the data entities 46. Where the data entities 46 are not linked to one another as a tree structure, the plurality of data entities 48 for the match features may interlink (or interrelate) the data entities 46 and interconnect their geometric shapes.

A match feature data entity 48 defines a location where a physical feature may associate with another physical feature within a model. For example, a match feature data entity 48 may define a location where a physical feature may couple with (abut, be fastened to, or connect to, for example) another physical feature within a model. By way of another example, a match feature data entity 48 may define a location where a physical feature may define a clearance (that is, a gap or a space) with another physical feature within a model.

FIG. 4A illustrates a schematic diagram of data entities, illustratively organised in a tree structure, for an intermediate pressure compressor blade disc according to an example. In more detail, the diagram illustrates an intermediate pressure (IP) compressor blade disc data entity 50, a disc drive arm data entity 52, a disc seal arm data entity 54, a disc rear arm data entity 56, a disc drive arm lug data entity 60, a disc drive arm lug match feature data entity 61 and a disc drive arm hole data entity 62. It should be appreciated that the data entities 50, 52, 54, 56, 58, 60, and 62 may be a subset of the data structure 38 for the gas turbine engine.

The tree structure is arranged so that the IP compressor blade disc data entity 50 is the root of the tree structure and is the parent feature to the disc drive arm data entity 52, the disc seal arm data entity 54, and the disc rear arm data entity 56. The disc drive arm data entity 52 is the parent feature to the disc drive arm lug data entity 60 and to the disc drive arm hole data entity 62. The disc drive arm lug data entity 60 is the parent feature to the disc drive arm lug match feature data entity 61.

In order to maintain the clarity of FIG. 4A, only the disc drive arm lug data entity 60 has a match feature data entity as child feature 61. However, it should be appreciated that in other examples, any or all of the data entities 50, 52 54, 56, and 62 may have match feature data entities as their child features.

FIG. 4B illustrates a schematic diagram of data entities, illustratively organised in a tree structure, for a front stub shaft according to an example. In more detail, the diagram illustrates a front stub shaft data entity 64 and a front stub shaft match feature data entity 65. It should be appreciated that the data entities 65, 65 may be a subset of the data structure 38 for the gas turbine engine. The tree structure is arranged so that the front stub shaft data entity 64 is the root of the tree structure and is the parent feature to the front stub shaft match feature 65.

FIG. 5 illustrates a graphical representation of the intermediate pressure (IP) compressor blade disc data entity 50, the disc drive arm data entity 52, the disc seal arm data entity 54, the disc rear arm data entity 56, the disc drive arm lug data entity 60, the disc drive arm hole data entity 62, and the front stub shaft data entity 65.

Figure 6:
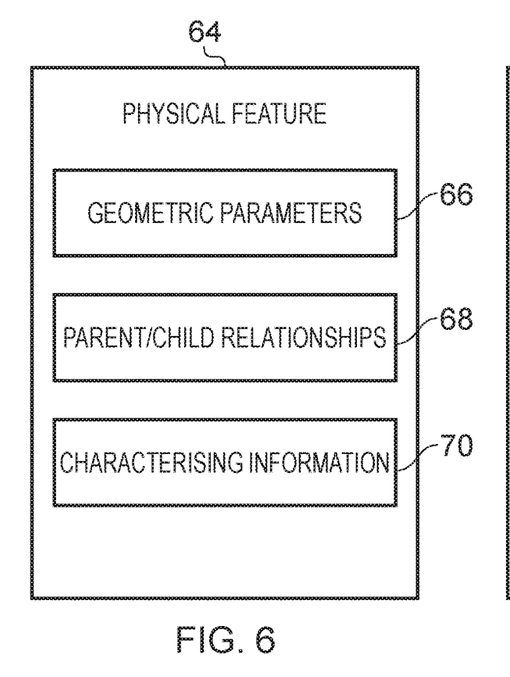
FIG. 6 illustrates a schematic diagram of a data entity for a physical feature according to various examples.

FIG. 6 illustrates a schematic diagram of a data entity 64 for a physical feature according to various examples. The data entity 64 may include geometric parameters 66, parent/child relationship data 68, and characterizing information 70. It should be appreciated that the above mentioned data in the data entity 64 is neither exhaustive nor exclusive. In other examples, any other set of data conveying information about the physical feature itself and its positioning inside the assembly may be included in the data entity 64.

The geometric parameters 66 define the shape of the physical feature. For example, where the physical feature is a disc, the geometric parameters 66 define the radius and depth of the disc. The geometric parameters 66 enable the controller 26 to present the physical feature via the output device 30 and graphically represent the physical feature. Where the physical feature is an aperture or a cavity in a parent physical feature, the geometric parameters 66 may define the aperture or cavity as the removal of material from the parent physical feature.

The parent/child relationship data 68 identifies the parent physical feature and/or the child physical feature(s) and/or match features for that particular physical feature. The parent/child relationship data 68 may also define the intended positioning between the physical feature and the parent physical feature and/or the child physical feature. The final position of a physical feature may be altered by the user or by the apparatus 24 according to certain criterion, which are described in greater detail in the following paragraphs.

The characterising information 70 includes data that characterises the physical feature and/or the data entity 64 for the physical feature. For example, the characterising information 70 may include a bill of materials for the physical feature, modification history for the data entity 64, manufacturing instructions, and/or the designer's notes.

Figure 7:
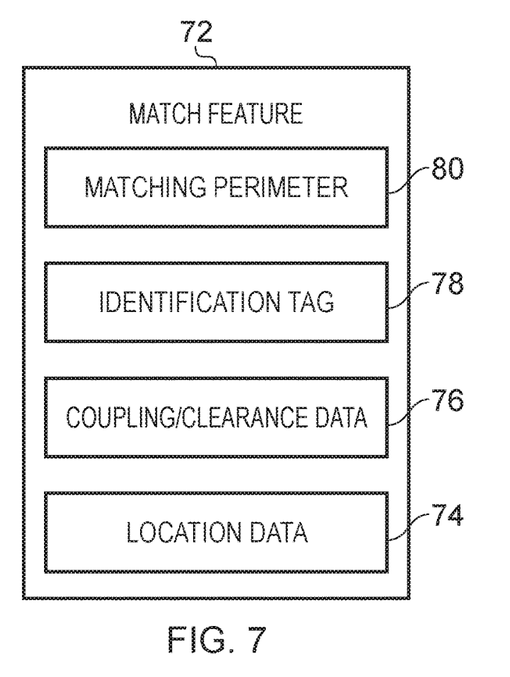
FIG. 7 illustrates a schematic diagram of a data entity for a match feature according to various examples.

FIG. 7 illustrates a schematic diagram of a match feature data entity 72 for a parent physical feature according to various examples. The match feature data entity 72 includes location data 74, coupling/clearance data 76, an identification tag 78 and a matching perimeter 80.

The location data 74 defines a location on the parent physical feature where the parent physical feature may associate (that is, couple or define a clearance) with another physical feature of the data structure 38 within a model. In other words, the location data 74 enables a pair of match features to associate their respective parent physical features within a model. For example, the disc drive arm lug match feature data entity 61 may include location data 74 that defines a location 82 on the disc drive arm lug 60. By way of another example, the front stub shaft match feature data entity 65 may include location data 74 that defines a location 84 on the front stub shaft 64. In some examples, the parent physical features of match features cannot change their (match feature's) attachment location.

The coupling/clearance data 76 defines whether the location (defined by the location data 74) on the parent physical feature is to couple with another physical feature, or to define a clearance with another physical feature. Where the coupling/clearance data 76 defines a clearance with another physical feature, the data 76 may include the closest distance to another physical feature relative to its location. Where the coupling/clearance data 76 defines a coupling point, the data 76 may include information concerning how the parent physical feature is to couple with another physical feature. For example, the data 76 may indicate that the physical features are integral with one another (for example, the physical features are cast together and do not include a joining interface) or are fastened together (for example, via a welded joint). By way of an example, the coupling/clearance data 76 of the disc drive arm lug match feature data entity 61 and the front stub shaft match feature data entity 65 defines that the disc drive arm lug 60 and the front stub shaft 64 are coupled together.

The identification tag 78 has a value selected from a plurality of values and where the matching feature data entities attached to two different parent physical features have the same identification tag 78 value, the two parent physical features may be associated with one another within a model (that is, the two parent physical features may be coupled together, or brought together to define a clearance). In other words, where a first match feature data entity (associated with a first parent physical feature) includes a first identification tag, and a second match feature data entity (associated with a second parent physical feature) includes a second identification tag, the first and second parent physical features may only be coupled with one another, or define a clearance there between, when the first identification tag is the same as the second identification tag.

By way of an example, the identification tag 78 of the disc drive arm lug match feature 61 may have a value of #, and the identification tag 78 of the front stub shaft match feature data entity 65 may have a value of #. Since the identification tag 78 of the disc drive arm lug match feature data entity 61 is the same as the identification tag 78 of the front stub shaft match feature data entity 65, the disc drive arm lug 60 may be associated with the front stub shaft 64 within a model.

The matching perimeter 80 (which may also be referred to as a 'bounding box') defines a perimeter around the location defined by the location data 74. Where matching perimeters 80 of match feature data entities overlap one another, the parent physical features 46 of those match feature data entities may be coupled together, or may be brought together to define a clearance there between.

By way of an example, the disc drive arm lug match feature data entity 61 includes a matching perimeter 80 that is indicated by a dotted line 86 in FIG. 5. Additionally, the front stub shaft match feature data entity 65 includes a matching perimeter 80 that is indicated by a dotted line 88 in FIG. 5. Since the matching perimeters indicated by the dotted lines 86, 88 overlap one another (as illustrated in FIG. 5), the disc drive arm lug 52 and the front stub shaft 64 may be coupled together in the model.

The operation of the apparatus 24 in modelling at least a part of a gas turbine engine is described in the following paragraphs with reference to FIG. 8.

At block 90, the method includes providing a data structure 38 including a plurality of data entities 46 for physical features and a plurality of data entities 48 for match features. The data structure 38 includes a first data entity for a first physical feature, a first match feature data entity associated with the first data entity, a second data entity for a second physical feature, and a second match feature data entity associated with the second data entity.

The data structure 38 (or a part of the data structure 38) may be provided by a user of the apparatus 24 who uses the apparatus 24 (or another computing device) to enter data for new physical feature data entities and match feature data entities to generate the data structure 38. For example, the user may operate the user input device 28 to enter data for new physical feature data entities and match feature data entities. By way of another example, the data structure 38 (or a part of the data structure 38) may be provided by the controller 26 by loading or accessing the data structure 38 from the memory 34.

In one example, the first data entity is the disc drive arm lug data entity 60, the first match feature data entity is the disc drive arm lug match feature data entity 61, the second data entity is the front stub shaft data entity 64, and the second match feature data entity is the front stub shaft match feature data entity 65, illustrated in FIGS. 4A & 4B and described above.

At block 92, the method includes determining whether the first match feature data entity and the second match feature data entity satisfy a first matching criterion. Where the first match feature data entity includes a first identification tag, and the second match feature data entity includes a second identification tag, the first matching criterion may be whether the first identification tag is the same as the second identification tag. Where the first match feature data entity includes a first matching perimeter, and the second match feature data entity includes a second matching perimeter, the first matching criterion may be whether the first matching perimeter and the second matching perimeter overlap in the model.

For example, the controller 26 may determine whether the matching perimeter 80 of the disc drive arm lug match feature data entity 61 overlaps with the matching perimeter 80 of the front stub shaft match feature data entity 65.

Block 92 may be initiated by a user of the apparatus 24 (via the user input device 28 for example) who has selected a new physical feature to be introduced to the model. Alternatively, block 92 may be initiated by the controller 26 that has selected a new physical feature to be introduced to the model (for example, the controller 26 may select and introduce a new physical feature that is a mandatory child physical feature of a parent physical feature already within the model).

At block 94, the method may include determining whether the first match feature and the second match feature satisfy a second matching criterion. Where block 92 includes determining whether identification tags of first and second match feature data entities are the same, block 94 may include determining whether matching perimeters of first and second match feature data entities overlap one another. Where block 92 includes determining whether matching perimeters of first and second match feature data entities overlap one another, block 94 may include determining whether the identification tags of the first and second match feature data entities are the same.

Where the first matching criterion (and when block 94 is performed, the second matching criterion) is not satisfied, the method ends and the physical features are not moved within the model. In some examples, the method may return to block 92 and is repeated for at least one further physical feature. In particular, the method may be repeated for two physical features, or may be repeated for one new physical feature and one of the first and second physical features.

Where the first matching criterion (and when block 94 is performed, the second matching criterion) is satisfied, the method moves to block 96.

In some examples, the method may include (at block 92 or 94 for example) enabling the user to choose whether one of the parent physical features are moveable/modifiable or non-moveable/non-modifiable. For example, the controller 26 may cause control of the output device 30 to present options to the user for whether one of the parent physical features is moveable/modifiable or non-moveable/non-modifiable. The user may then operate the user input device 28 to provide a control signal to the controller 26 to select whether one of the parent physical features are moveable/modifiable or non-moveable/non-modifiable. This characteristic may be referred to as 'design freeze'.

At block 96, the method includes determining whether the first physical feature is moveable/modifiable within the model. The controller 26 may read the first data entity to determine whether the first physical feature is moveable/modifiable within the model to enable association of the first and second physical features (that is, whether the first physical feature is moveable/modifiable to enable coupling of the first and second physical features, or to enable the first and second physical features to define a clearance).

At block 98, the method includes determining whether the second physical feature is moveable or modifiable within the model. The controller 26 may read the second data entity to determine whether the second physical feature is moveable/modifiable within the model to enable association of the first and second physical features (that is, whether the second physical feature is moveable/modifiable to enable coupling of the first and second physical features, or to enable the first and second physical features to define a clearance).

Where it is determined in block 96 that the first physical feature is not moveable/non-modifiable within the model, the method moves to block 100 and the method includes preventing movement (or not performing movement) of the first physical feature within the model. If the second physical feature is determined to be non-moveable/non-modifiable, the method moves to block 102 and the method includes preventing movement (or not performing movement) of the second physical feature within the model and the method is ended. In some examples, the method may return to block 92 and is repeated for at least one further physical feature. For example, the method may be repeated for two physical features, or may be repeated for one new physical feature and one of the first and second physical features.

If the second physical feature is determined to be moveable/modifiable, the first physical feature remains in position and the second physical feature is moved into association with the first physical feature (for example, to couple or to define a clearance). For example, where it is determined in block 96 that the disc drive arm lug 60 is non-moveable/non-modifiable within the model, the method moves to block 100 and the disc drive arm lug 60 is not moved within the model by the controller 26. The method may then move the front stub shaft 64 so that the disc drive arm lug 60 and the front stub shaft 64 couple to one another at the locations 82, 84.

Where it is determined in block 98 that the second physical feature is not moveable/non-modifiable within the model, the method moves to block 102 and the method includes preventing movement (or not performing movement) of the second physical feature within the model. If the first physical feature is determined to be non-moveable/non-modifiable, the method moves to block 100 and the method includes preventing movement (or not performing movement) of the first physical feature within the model and the method is ended. In some examples, the method may return to block 92 and is repeated for at least one further physical feature. In particular, the method may be repeated for two physical features, or may be repeated for one new physical feature and one of the first and second physical features.

If the first physical feature is determined to be moveable/modifiable, the second physical feature remains in position and the first physical feature is moved into association with the second physical feature (for example, to couple or to define a clearance). For example, where it is determined in block 98 that the front stub shaft 64 is non-moveable/non-modifiable within the model, the method moves to block 102 and the front stub shaft 64 is not moved within the model by the controller 26. The method may then move the disc drive arm lug 60 so that the disc drive arm lug 60 and the front stub shaft 64 couple to one another at the locations 82, 84.

Where it is determined in blocks 96 & 98 that the first and second physical features are moveable/modifiable within the model, the method moves to block 104 and the method includes moving the first and second physical features within the model into association with one another (for example, to couple or to define a clearance). In some examples, the first and second physical features may be moved an equal distance within the model. In other examples, the first and second physical features may be moved different distances within the model (for example, the data entities for the first and second physical features may include movement weighting factors that reduce or increase the movement of the physical features).

For example, where it is determined in blocks 96 and 98 that the disc drive arm lug 60 and the front stub shaft 64 are moveable/modifiable within the model, the method moves to block 104 and the disc drive arm lug 60 and the front stub shaft 64 are moved within the model by the controller 26.

Where the first and second match feature data entities define a clearance between the first and second physical features at the first and second locations, the method may include positioning the first and second physical features within the model to have the greater of the first clearance and the second clearance between the first location and the second location. The movements performed by the controller 26 on the entries in the data structure 36 may involve a plurality of geometric transformations. In particular, such movements may be achieved by modifications of the features indirectly associated to the match feature data entities. As a way of example, any of the movements in block 104 may be performed by modifying the location of attachment of the disc drive arm 52 and that of front stub shaft 64 rather than modifying the geometric parameters of those features.

In some examples, the controller 26 may satisfy the spatial relation requested by the match features by altering the dimensional data entries in physical feature data entities directly carrying the match features, or any other data entries in physical feature data entities which determine the final resting place of the match features. For example, the controller 26 may parse matching pairs of physical features and provide instructions to their grand-parent physical features to change the location of attachment of their parent physical feature, if parent physical features are non-moveable/non-modifiable or their internal construction (that is, their user prescribed geometry configuration) does not allow them to do so.

When block 104 is completed the method may be ended or may return to block 92 and is repeated for at least one further physical feature. For example, the method may be repeated for two new physical features (that is, a third and a fourth physical feature such as the disc drive arm 52 and the disc drive arm lug 60 illustrated in FIG. 4) or may be repeated for one new physical feature and one of the first and second physical features (that is one of the first and second physical features, and a third physical feature, such as the intermediate pressure compressor blade disc 50 and the disc seal arm 54).

In some examples, due to the procedural nature of parsing method, the already satisfied match feature pairs may break and further iterations of the blocks may be required to ensure that all constraints imposed by match features are satisfied. For example, first and second physical features may be coupled via first and second match features. When third and fourth physical features are subsequently coupled via third and fourth match features the association of first and second physical features may break and hence, the blocks of the method may be repeated to re-associate the first and second physical features using the first and second match features. It should be appreciated that a physical feature data entity constrained by multiple match feature data entities undergoes multiple dimensional and shape modifications, including the change of attachment location on its parent physical feature.

Where the method is ended, the controller 26 may control the output device 30 to provide the generated model to a user. For example, the controller 26 may control a display of the output device 30 to display a general assembly image of a gas turbine engine.

The apparatus 24 and the above described method may provide several advantages. First, since the method may be performed iteratively for a plurality of physical features, the apparatus 24 and method may provide consistency within the model after changes have been made to one of the physical features within the model. Second, the apparatus 24 and the above described method may enable clearances to be defined between two physical features. Advantageously, a user may use the generated model to learn the clearance between two physical features. Third, the apparatus 24 and the above described method enable two separate physical features to be coupled together to provide mechanical continuity within the model. Fourth, the apparatus 24 and the method may allow assembly from non-matching components. According to an example, the user may assemble a model of a gas turbine or part of a gas turbine using data prepared in advance to represent one or more machines of different sizes or layout. In this case the user may rely on the method in the present disclosure to adjust the dimensions and positions of at least some of the components in the model. Fifth, the apparatus 24 and the method may reduce the human resources required to generate a model since the positioning of physical features into association with one another may be automatically performed by the controller 26.

It will be understood that the disclosure is not limited to the embodiments above-described and various modifications and improvements can be made without departing from the concepts described herein. For example, the above described methods may be used to model machinery other than gas turbine engines, and may be used to model rotating electrical machinery for example. Furthermore, the above described methods may be used to model a gas turbine engine having a different architecture to the one mentioned in the preceding paragraphs. For example, the above described methods may be used to model a two shaft gas turbine engine or any other mechanical system or apparatus.

Except where mutually exclusive, any of the features may be employed separately or in combination with any other features and the disclosure extends to and includes all combinations and sub-combinations of one or more features described herein.

What is claimed is:

1. A method of modeling at least a part of a gas turbine engine, the method comprising:
storing a data structure including:
a first data entity representing a geometrical shape of a first physical feature;
a second data entity representing a geometrical shape of a second physical feature, the first physical feature and the second physical feature corresponding to physical parts of the gas turbine engine being modeled;
a first match feature data entity defining a first spatial relationship between the first physical feature and another neighboring physical feature in the gas turbine engine being modeled;
a second match feature data entity defining a second spatial relationship between the second physical feature and another neighboring physical feature in the gas turbine engine being modeled; and
the first data entity being associated with the first match feature data entity, and the second data entity being associated with the second match feature data entity;
determining whether the first match feature data entity and the second match feature data entity satisfy a first matching criterion indicating that the first spatial relationship is between the first physical feature and the second physical feature, and the second spatial relationship is between the second physical feature and the first physical feature; and
in response to determining that the first match feature data entity and the second match feature data entity satisfy the first matching criterion, modeling the part of the gas turbine engine by performing movement of the first physical feature and the second physical feature in relation to each other in the gas turbine engine being modeled based on the first and second spatial relationships.

2. The method as claimed in claim 1, wherein the first physical feature and/or the second physical feature are one of:
a part of a component of a gas turbine engine;
a component of a gas turbine engine; and
an assembly of components of a gas turbine engine.

3. The method as claimed in claim 1, wherein:
the data structure is arranged in a tree structure having parent and child relationships between data entities; and
the blocks of: determining whether the first match feature data entity and the second match feature data entity satisfy the first matching criterion; and performing movement of the first physical feature and the second physical feature in relation to each other in the gas turbine engine being modeled, are performed according to an order of the parent and child relationships between data entities in the tree structure.

4. The method as claimed in claim 1, wherein:
the first match feature data entity includes a first matching perimeter;
the second match feature data entity includes a second matching perimeter; and
the first matching criterion is whether the first matching perimeter and the second matching perimeter overlap in the gas turbine engine being modeled.

5. The method as claimed in claim 1, wherein:
the first match feature data entity includes a first identification tag;
the second match feature data entity includes a second identification tag; and
the first matching criterion is whether the first identification tag is the same as the second identification tag.

6. The method as claimed in claim 5, comprising:
determining whether the first match feature data entity and the second match feature data entity satisfy a second matching criterion, wherein:
the first match feature data entity includes a first matching perimeter;
the second match feature data entity includes a second matching perimeter; and
the second matching criterion is whether the first matching perimeter and the second matching perimeter overlap in the gas turbine engine being modeled.

7. The method as claimed in claim 1, wherein:
the first spatial relationship identifies a first location for coupling the first physical feature with another neighboring physical feature; and
the second spatial relationship identifies a second location for coupling the second physical feature with another neighboring physical feature.

8. The method as claimed in claim 7, wherein:
performing movement of the first physical feature and the second physical feature in relation to each other in the gas turbine engine being modeled includes coupling the first and second physical features at the first and second locations respectively.

9. The method as claimed in claim 1, wherein:
the first spatial relationship defines a first clearance between the first physical feature and another neighboring physical feature; and
the second spatial relationship defines a second clearance between the second physical feature and another neighboring physical feature.

10. The method as claimed in claim 9, wherein:
performing movement of the first physical feature and the second physical feature in relation to each other in the gas turbine engine being modeled includes positioning the first and second physical features to have a greater one of the first clearance and the second clearance.

11. The method as claimed in claim 1, wherein:
the data structure comprises a plurality of data entities representing geometrical shapes of a plurality of physical features;
at least some of the data entities are associated with a match feature data entity defining a respective spatial relationship between a respective physical feature and another respective neighboring physical feature; and
the method comprises:
iteratively performing determination of match point satisfaction of the first matching criterion for the plurality of data entities; and
modeling the part of the gas turbine engine by performing relative movement for the plurality of physical features in accordance with the respective spatial relationship for each of the plurality of physical features.

12. The method as claimed in claim 1, comprising:
receiving a user input signal indicating that at least one of the first physical feature and the second physical are moveable or modifiable, or non-moveable or non-modifiable within the gas turbine engine being modeled.

13. The method as claimed in claim 1, comprising:

determining whether the first physical feature is moveable or modifiable within the gas turbine engine being modeled; and modeling the part of the gas turbine engine by preventing movement, or not performing movement or modification, of the first physical feature in the gas turbine engine being modeled where the first physical feature is determined to be non-moveable or non-modifiable.

14. The method as claimed in claim 1, comprising:

determining whether the second physical feature is moveable or modifiable within the gas turbine engine being modeled; and modeling the part of the gas turbine engine by preventing movement, or not performing movement or modification, of the second physical feature in the gas turbine engine being modeled where the second physical feature is determined to be non-moveable or non-modifiable.

15. The method as claimed in claim 1, comprising:

determining whether the first and second physical features are moveable or modifiable within the gas turbine engine being modeled, wherein performing movement of the first physical feature and the second physical feature in relation to each other in the gas turbine engine being modeled includes moving or modifying pre-set geometry configurations of the first and second physical features where the first and second physical features are determined to be moveable or modifiable.

16. A non-transitory computer readable storage medium comprising computer readable instructions executed by a computer processor to perform the method as claimed in claim 1.

17. Apparatus for modelling at least a part of a gas turbine engine, the apparatus comprising: at least one computer processor programmed to perform the method as claimed in claim 1.

* * * * *